(12) United States Patent
Abbas et al.

(10) Patent No.: US 12,080,865 B2
(45) Date of Patent: Sep. 3, 2024

(54) THERMAL REGULATION FOR ELECTRICAL DEVICES

(71) Applicant: ARKEMA FRANCE, Colombes (FR)

(72) Inventors: Laurent Abbas, Pierre-Benite (FR); Dominique Garrait, Pierre-Benite (FR); Jérémie Walker, Pierre-Benite (FR)

(73) Assignee: ARKEMA FRANCE, Colombes (FR)

( * ) Notice: Subject to any disclaimer, the term of this patent is extended or adjusted under 35 U.S.C. 154(b) by 188 days.

(21) Appl. No.: 17/794,016

(22) PCT Filed: Oct. 19, 2020

(86) PCT No.: PCT/FR2020/051879
§ 371 (c)(1),
(2) Date: Jul. 20, 2022

(87) PCT Pub. No.: WO2021/148725
PCT Pub. Date: Jul. 29, 2021

(65) Prior Publication Data
US 2023/0051363 A1 Feb. 16, 2023

(30) Foreign Application Priority Data

Jan. 20, 2020 (FR) ........................... 2000514

(51) Int. Cl.
*H01M 10/6569* (2014.01)
*C09K 5/04* (2006.01)
(Continued)

(52) U.S. Cl.
CPC ......... *H01M 10/6569* (2015.04); *C09K 5/044* (2013.01); *H01M 8/04029* (2013.01);
(Continued)

(58) Field of Classification Search
CPC ......... H01M 10/6569; H01M 8/04029; H01M 10/613; H01M 10/625; C09K 5/044;
(Continued)

(56) References Cited

U.S. PATENT DOCUMENTS 9,175,146 B2 * 11/2015 Mercx ................. C08K 3/04
2012/0256119 A1 10/2012 Bouvier et al.
(Continued)

FOREIGN PATENT DOCUMENTS

FR 2962442 A1 1/2012
FR 2973809 A1 10/2012
(Continued)

OTHER PUBLICATIONS

International Search Report (PCT/ISA/210) with translation and Written Opinion (PCT/ISA/237) mailed on Jan. 18, 2021, by the European Patent Office as the International Searching Authority for International Application No. PCT/FR2020/051879. (11 pages).

*Primary Examiner* — Lionel Nouketcha
(74) *Attorney, Agent, or Firm* — BUCHANAN, INGERSOLL & ROONEY PC

(57) ABSTRACT

The use of a heat-transfer composition including at least one refrigerant chosen from halogenated hydrocarbons, perhalogenated hydrocarbons, fluorinated ketones, fluorinated ethers and also combinations thereof, and at least one dielectric fluid, for cooling a battery of an item of equipment, such as an electric or hybrid vehicle, the heat-transfer composition having a volume resistivity of greater than or equal to 106 Ω·cm at 25° C.

14 Claims, 1 Drawing Sheet

(51) Int. Cl.
    *H01M 8/04029*    (2016.01)
    *H01M 10/613*     (2014.01)
    *H01M 10/625*     (2014.01)
    *H05K 7/20*       (2006.01)

(52) U.S. Cl.
    CPC ....... *H01M 10/613* (2015.04); *H01M 10/625* (2015.04); *H05K 7/20381* (2013.01); *C09K 2205/126* (2013.01); *C09K 2205/24* (2013.01)

(58) Field of Classification Search
    CPC .......... C09K 2205/126; C09K 2205/24; C09K 5/10; Y02E 60/10
    See application file for complete search history.

(56) References Cited

U.S. PATENT DOCUMENTS

| | | |
|---|---|---|
| 2014/0057826 A1 | 2/2014 | Chen et al. |
| 2018/0327645 A1 | 11/2018 | Boussand |
| 2020/0231774 A1 | 7/2020 | Singh et al. |
| 2021/0046802 A1 | 2/2021 | Rached |

FOREIGN PATENT DOCUMENTS

| | | |
|---|---|---|
| WO | 2016146197 A1 | 9/2016 |
| WO | 2019158857 A1 | 8/2019 |
| WO | 2019162598 A1 | 8/2019 |
| WO | 2019162599 A1 | 8/2019 |
| WO | 2019197783 A1 | 10/2019 |
| WO | 2019242977 A1 | 12/2019 |
| WO | 2020132335 A1 | 6/2020 |

\* cited by examiner

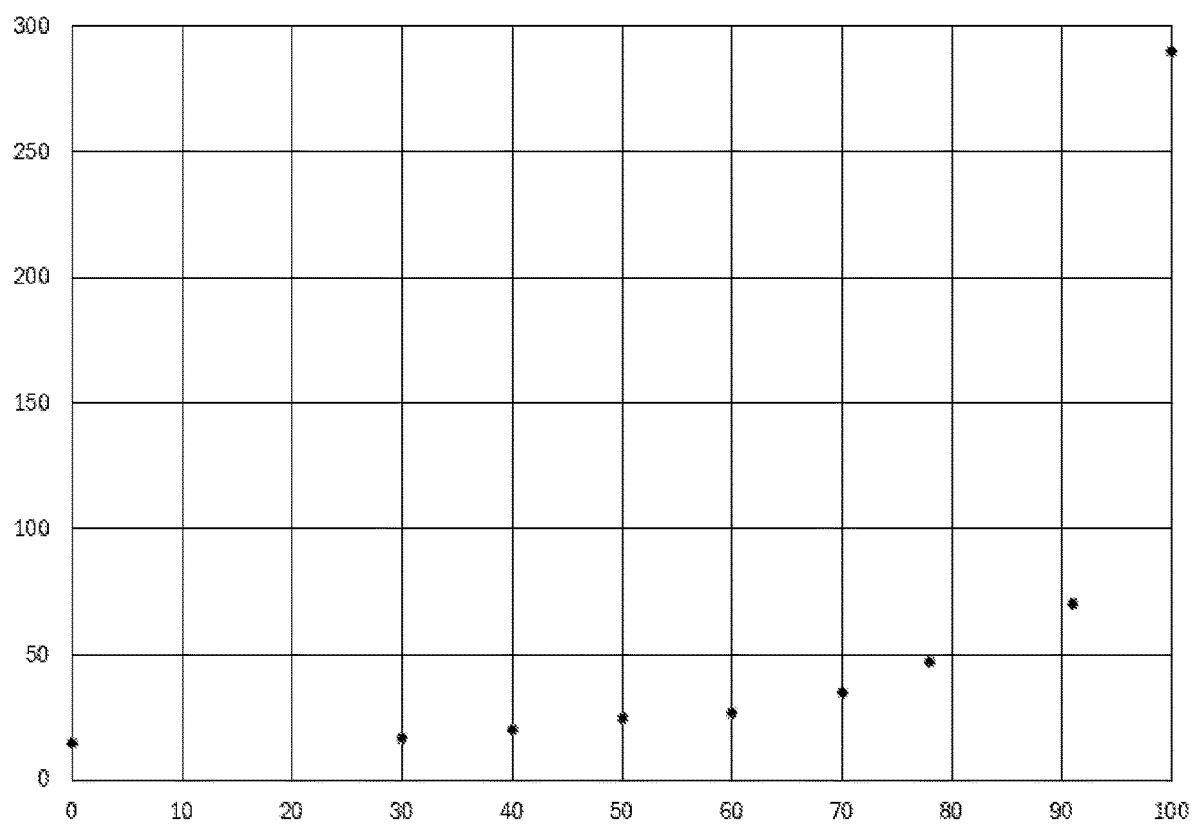

THERMAL REGULATION FOR ELECTRICAL DEVICES

FIELD OF THE INVENTION

The present invention relates to the use of a heat-transfer composition comprising at least one refrigerant fluid and at least one dielectric fluid, for regulating the temperature of an item of equipment (notably for cooling the equipment), such as a battery, an electrical component or a fuel cell. The invention applies in particular to the batteries of electric or hybrid vehicles.

TECHNICAL BACKGROUND

The need to dissipate high heat flows is fundamental in many applications, notably the cooling of batteries, electronic components and fuel cell systems. Liquid-vapor phase change cooling proves to be an effective solution for dissipating large amounts of heat while at the same time maintaining a uniform system temperature.

In particular, the batteries in electric or hybrid vehicles give maximum performance under specific working conditions and especially within a quite specific temperature range. Thus, in cold climates, the autonomy of electric or hybrid vehicles is a problem, all the more so since the high heating requirements consume a large proportion of the stored electrical energy. In addition, at low temperatures, the power available from the battery is low, which poses a driving problem. Moreover, the cost of the battery contributes significantly toward the cost of the electric or hybrid vehicle.

Conversely, cooling of the battery is a major safety issue. Various dielectric oils may be used to cool the battery of an electric or hybrid vehicle. However, when rapid charging of the battery is required, the use of dielectric oils alone is not sufficient to efficiently cool the battery, notably because of the absence of evaporation due to the high boiling points of these oils. In this case, more volatile and less viscous fluids need to be used. However, these fluids usually have higher vapor pressures than those observed in the case of dielectric oils, which may require reinforcement of the battery casing (and thus an increase in its weight) in order to withstand the pressure. These fluids are moreover more expensive than dielectric oils.

Furthermore, it is important to use compositions that are sparingly flammable or non-flammable in the vicinity of the battery so as to eliminate any safety risks associated with the use of these compositions.

FR 2973809 relates to the use of a zeolite adsorbent for improving the thermal stability of an oil subjected to temperature variations in coolant fluid compositions.

FR 2962442 relates to a stable composition comprising 2,3,3,3-tetrafluoropropene, for use in refrigeration and air conditioning.

US 2014/057826 relates to a heat-transfer composition comprising at least one hydrochlorofluoroolefin used for air conditioning, refrigeration and heat pump applications or used for cleaning products, components, substrates or other articles containing the substance to be cleaned.

WO 2019/242977 relates to a fluid-insulated switchgear which comprises a fluid compartment filled with an electrically insulating fluid and an electrical conductor located in the fluid compartment and electrically insulated by the electrically insulating fluid.

WO 2019/162598 relates to the use of a refrigerant comprising 2,3,3,3-tetrafluoropropene for maintaining the temperature of a battery of an electric or hybrid vehicle within a temperature range.

WO 2019/162599 relates to the use of a refrigerant comprising 2,3,3,3-tetrafluoropropene for preheating a battery of an electric or hybrid vehicle when the vehicle is started.

WO 2019/197783 relates to a process for cooling and/or heating a body or fluid in a motor vehicle, by means of a system comprising a vapor compression circuit in which flows a first heat-transfer composition and a secondary circuit in which flows a second heat-transfer composition.

There is a need to ensure optimum functioning of batteries in electric or hybrid vehicles, so as to provide safe and efficient batteries without increasing the costs associated with the batteries.

SUMMARY OF THE INVENTION

The invention relates firstly to the use of a heat-transfer composition comprising at least one refrigerant chosen from halogenated hydrocarbons, fluorinated ketones, fluorinated and perhalogenated ethers and also combinations thereof, and at least one dielectric fluid, for regulating the temperature of an item of equipment chosen from a battery, an electrical component or a fuel cell, the heat-transfer composition having a volume resistivity of greater than or equal to $10^6$ Ω·cm at 25° C.

In certain embodiments, the refrigerant comprises or is 1-chloro-3,3,3-trifluoropropene, preferably in E form.

In certain embodiments, the refrigerant is present in a content of from 10% to 80%, preferably from 10% to 60%, and even more preferably 10% to 40% by weight relative to the total weight of the heat-transfer composition.

In certain embodiments, the dielectric fluid is chosen from mineral dielectric oils, synthetic dielectric oils, and vegetable dielectric oils; the synthetic fluids preferably being aromatic hydrocarbons chosen from alkylbenzenes, alkyldiphenylethanes, alkylnaphthalenes, methylpolyarylmethanes and also combinations thereof; the dielectric fluid more preferably being a mixture of benzyltoluene and dibenzyltoluene.

In certain embodiments, the dielectric fluid is present in a content of from 20% to 90%, preferably 40% to 90%, more preferably 40% to 60% by weight relative to the total weight of the heat-transfer composition.

In certain embodiments, the heat-transfer composition has a liquid saturation temperature of from 20 to 80° C., and preferably from 30 to 70° C. at a pressure of 1 bar.

In certain embodiments, the heat-transfer composition has a breakdown voltage of greater than or equal to 20 kV at 20° C.

In certain embodiments, the heat-transfer composition consists essentially of 1-chloro-3,3,3-trifluoropropene and a mixture of monobenzyltoluene and dibenzyltoluene.

In certain embodiments, the heat-transfer composition consists essentially of 1-chloro-3,3,3-trifluoropropene and a polyol ester synthesized from pentaerythritol.

In certain embodiments, the heat-transfer composition exchanges heat with an additional heat-transfer composition, preferably contained in a vapor compression circuit.

In certain embodiments, the above use is for the cooling of equipment. In certain embodiments, the regulation of the temperature of the equipment is performed by placing the equipment in direct contact with the heat-transfer composition, preferably by immersing the equipment in the heat-transfer composition.

In certain embodiments, the equipment is a battery of an electric or hybrid vehicle.

In certain embodiments, the above use is performed during charging of the vehicle's battery, the vehicle's battery preferably being fully charged in a time of less than or equal to 30 minutes, and preferably less than or equal to 15 minutes from its full discharge.

The present invention meets the need expressed above. Specifically, it ensures optimum functioning of the equipment, in particular a battery of an electric or hybrid vehicle, so as to provide safe and efficient batteries without increasing the costs associated with the batteries.

This is accomplished by means of the use of a heat-transfer composition comprising at least one refrigerant chosen from halogenated hydrocarbons, fluorinated ketones, fluorinated and perhalogenated ethers and also combinations thereof, and at least one dielectric fluid, the heat-transfer composition having a volume resistivity greater than or equal to $10^6$ Ω·cm at 25° C.

Throughout the text hereinbelow, the case is considered in which the equipment is a battery, in particular a battery of an electric or hybrid vehicle. However, the invention can be implemented in a similar manner with another item of equipment, in particular an electrical component or a fuel cell.

Specifically, the combination of a dielectric fluid with a refrigerant makes it possible to provide a composition that is volatile and sparingly viscous (notably in comparison with a composition consisting of a dielectric fluid) which makes it possible to increase the efficiency and the life of the batteries, notably during rapid charging, without increasing the costs.

The fact that the composition has a volume resistivity of greater than or equal to $10^6$ Ω·cm at 25° C. (and preferably a breakdown voltage of greater than or equal to 20 kV at 20° C.) ensures that the dielectric properties of the composition are compatible with use in the vicinity of the equipment, notably in the vicinity of the battery which is in direct or indirect contact therewith.

The refrigerant enables a reduction in the viscosity of the dielectric fluid and makes the composition more volatile and thus more effective. The refrigerant also enables a reduction in the liquid saturation temperature of the composition (relative to a composition comprising only dielectric fluid) and improves the efficiency of cooling of the battery.

Furthermore, the vapor pressure of the composition is generally lower than that of the refrigerant alone, which makes it possible to reduce the constraints regarding the reinforcement of the enclosure containing the battery to withstand the pressure and thus the weight of the vehicle and thereby improve the vehicle performance.

The cost of the composition is generally less than that of the refrigerant alone.

Advantageously, the combination of refrigerant with the dielectric fluid also makes it possible to obtain compositions that are sparingly flammable or non-flammable.

BRIEF DESCRIPTION OF THE FIGURES

FIG. 1 is a diagram showing the variation of the liquid saturation temperature of the heat-transfer composition at a pressure of 1 bar, as a function of the content of refrigerant (see the examples section below). The temperature is shown on the y-axis (° C.) and the content of dielectric fluid is shown on the x-axis (wt %).

DETAILED DESCRIPTION

The invention is now described in greater detail and in a nonlimiting manner in the description that follows.
Heat-Transfer Composition The heat-transfer composition according to the invention comprises at least one refrigerant and at least one dielectric fluid.

The term "refrigerant" means a fluid that is capable of absorbing heat by evaporating at low temperature and low pressure and of expelling heat by condensing at high temperature and high pressure.

The refrigerant is chosen from halogenated hydrocarbons, perhalogenated hydrocarbons, fluorinated ketones, fluorinated ethers and also combinations thereof.

Among the halogenated hydrocarbons, mention may be made of hydrofluorocarbons, hydrochlorofluorocarbons, hydrofluoroolefins, hydrochloroolefins and hydrochlorofluoroolefins.

By way of example, the refrigerant may be chosen from 1,1,1,4,4,4-hexafluorobut-2-ene (HFO-1336mzz, E or Z isomer), 1-chloro-3,3,3-trifluoropropene (HCFO-1233zd, E or Z isomer), 3,3,4,4,4-pentafluorobut-1-ene (HFO-1345fz), 2,4,4,4-tetrafluorobut-1-ene (HFO-1354mfy), 1,1,2-trifluoroethylene (HFO-1123), 1,1,1,3,3-pentafluoropropane (HFC-245fa), 2,3,3,3-tetrafluoropropene (HFO-1234yf), 1,3,3,3-tetrafluoropropene (HFO-1234ze, E or Z isomer), difluoromethane (HFC-32), 1,1,1,2-tetrafluoroethane (HFC-134a), 1,1,2,2-tetrafluoroethane (HFC-134), 1,1-difluoroethane (HFC-152a), pentafluoroethane (HFC-125) 1,1,1,3,3-pentafluorobutane (HFC-365mfc), fluoroethane (HFC-161), 1,1,1,2,3,3,3-heptafluoropropane (HFC-227ea), 1,1,1-trifluoropropane (HFC-263fb), 1,2-dichloroethylene (E or Z) and combinations thereof.

Among the perhalogenated hydrocarbons, mention may be made of perfluoro compounds such as dodecafluoropentane, tetradecafluorohexane, hexadecafluoroheptane and combinations thereof.

Among the fluorinated ketones, examples that may be mentioned include fluorinated monoketones, perfluorinated monoketones such as 1,1,1,2,2,4,5,5,5-nonafluoro-4-(trifluoromethyl)-3-pentanone and combinations thereof.

Among the fluorinated ethers, mention may be made of hydrofluoroethers such as methoxynonafluorobutane (HFE7100), ethoxynonafluorobutane (HFE-7200), 1-methoxyheptafluoropropane (HFE-7000), perfluoropolyethers and combinations thereof.

The refrigerant may comprise several, for example two, or three, or four or five compounds as described above.

In certain preferred embodiments, the refrigerant comprises HFO-1233zd in E or Z form, and more preferably in E form.

Preferably, the heat-transfer composition according to the invention essentially comprises only one compound as refrigerant. In this case, it is preferable that this refrigerant be HFO-1233zd in E or Z form, and more preferably in E form.

The composition according to the invention may be prepared by any means well known to a person skilled in the art, for example by simple mixing of the various components of the composition according to the invention.

The refrigerant according to the invention may notably have a liquid viscosity of from 0.1 to 2 cP at 20° C., preferably from 0.2 to 0.9 CP at 20° C. The viscosity may be measured according to the method indicated in example 2 below.

The refrigerant according to the invention may notably have a boiling point (liquid saturation temperature) of from 0 to 90° C., preferably from 15 to 70° C., at 1 bar.

For the purposes of the present invention, the term "dielectric fluid" means a fluid which does not conduct electricity (or is only sparingly conductive) but allows electrostatic forces to be exerted.

Preferably, the dielectric fluid is chosen from mineral dielectric oils and synthetic dielectric oils, and also mixtures thereof in any proportion.

The term "oil" means a fatty substance which is in a liquid form at room temperature and which is immiscible with water. Oils are fatty liquids of plant, mineral or synthetic origin.

Insulating (dielectric) oils have heat-transfer fluid characteristics so as to allow the heat generated to be dissipated.

The oil included in the heat-transfer composition may notably be chosen from mineral dielectric oils, synthetic dielectric oils, and vegetable dielectric oils and also combinations thereof.

According to one embodiment of the invention, the dielectric fluid comprises at least one mineral dielectric oil. Nonlimiting examples of such mineral dielectric oils include paraffinic oils and naphthenic oils, such as the dielectric oils of the Nytro family, sold by the company Nynas (in particular Nytro Taurus, Nytro Libra, Nytro 4000X and Nytro 10XN), and Dalia, sold by the company Shell.

The mineral dielectric oils may be paraffinic oils (i.e. linear or branched saturated hydrocarbons) such as Nytro Taurus oil sold by the company Nynas and Dalia oil sold by the company Shell, or naphthenic oils (i.e. cyclic paraffins) such as Nytro Libra and Nytro 10XN oils sold by the company Nynas, aromatic compounds (i.e. cyclic unsaturated hydrocarbons containing one or more rings characterized by double bonds alternating with single bonds) and non-hydrocarbon compounds.

According to another embodiment of the invention, the dielectric fluid is a synthetic dielectric oil. Nonlimiting examples of such synthetic dielectric oils include aromatic hydrocarbons, aliphatic hydrocarbons, silicone oils, esters, polyesters and polyol esters, and also mixtures of two or more thereof in all proportions.

Among the aromatic hydrocarbons, mention may be made, in a nonlimiting manner, of alkylbenzenes, alkyldiphenylethanes (for example phenylxyxlyethane (PXE), phenylethylphenylethane (PEPE), monoisopropylbiphenyl (MIPB), 1,1-diphenylethane (1,1-DPE), alkylnaphthalenes (for example diisopropylnaphthalene (DIPN), methylpolyarylmethanes (for example benzyltoluene (BT) and dibenzyltolulene DBT), and mixtures thereof. In said aromatic hydrocarbons, it should be understood that at least one ring is aromatic and that optionally one or more other rings present may be partially or totally unsaturated. Most particularly preferred examples are the dielectric fluids sold by Soltex Inc, by the company Arkema under the name Jarylec®, and SAS 60E by the company JX Nippon Chemical Texas Inc.

Among the aliphatic hydrocarbons, mention may be made, in a nonlimiting manner, of poly(alpha)olefins (PAO), for example polyisobutenes (PIB) or olefins of vinylidene type, such as those sold, for example, by the company Soltex Inc.

Among the silicone oils, mention may be made, in a nonlimiting manner, of linear silicone oils of the polydimethylsiloxane type, for instance those sold by the company Wacker under the name Wacker® AK.

Among the synthetic esters, mention may be made, in a nonlimiting manner, of esters of the phthalic type such as dioctyl phthalate (DOP) or diisononyl phthalate (DINP) (sold, for example, by the company BASF).

Mention may also be made, in a nonlimiting manner, of esters resulting from the reaction between a polyalcohol and an organic acid, in particular an acid chosen from saturated or unsaturated $C_4$ to $C_{22}$ organic acids. As nonlimiting examples of such organic acids, mention may be made of undecanoic acid, heptanoic acid, octanoic acid, palmitic acid and mixtures thereof. Among the polyols that may be used for the synthesis of the abovementioned esters, nonlimiting examples that may be mentioned include pentaerythritol for the synthesis of the oil Mivolt DF7 Midel 7131, and Mivolt DFK from the company M&I Materials.

Thus, the synthetic esters resulting from the reaction between a polyalcohol and an organic acid are, for example, Midel 7131 from the company M&I Materials or the esters of the Nycodiel range from the company Nyco.

Among the natural esters and plant oils, nonlimiting examples that may be mentioned include products from oily seeds or from other sources of natural origin. Nonlimiting examples that may be mentioned include FR3™ or Envirotemp™ sold by the company Cargill or Midel eN 1215 sold by the company M&I Materials.

The heat-transfer composition according to the invention may comprise one oil or more, for example two, or three, or four or five oils.

A preferred dielectric fluid is a mixture of benzyltoluene and dibenzyltoluene.

Another preferred dielectric fluid is a polyol ester made from pentaerythritol.

Preferably, the heat-transfer composition according to the invention comprises only one dielectric fluid. In this case, it is preferable for this dielectric fluid to be a methylpolyarylmethane and more particularly a mixture of benzyltoluene and dibenzyltoluene (such as Jarylec® from the company Arkema); or a polyol ester made from pentaerythritol.

The dielectric fluid may notably have a viscosity of from 1 to 60 cP at 20° C. according to the standard ISO3104.

The dielectric fluid may notably have a boiling point of greater than 30° C., as measured by ebulliometry.

The dielectric fluid may be present in the composition in a content of from more than 0 to less than 100%, preferably from 20% to 90%, more preferably from 40% to 90%, and even more preferably from 40% to 60% by weight relative to the total weight of the heat-transfer composition.

For example, this content may be from 1% to 10%; or from 10% to 15%; or from 15% to 20%; or from 20% to 25%; or from 25% to 30%; or from 30% to 35%; or from 35% to 40%; or from 40% to 45%; or from 45% to 50%; or from 50% to 55%; or from 55% to 60%; or from 60% to 65%; or from 65% to 70%; or from 70% to 75%; or from 75% to 80%; or from 80% to 85%; or from 85% to 90%; or from 90% to 95%; or from 95% to 99% by weight relative to the total weight of the heat-transfer composition.

The refrigerant may be present in the composition in a content of from more than 0 to less than 100%, preferably from 10% to 80%, preferably from 10% to 60%, and more preferably from 10% to 40% by weight relative to the total weight of the heat-transfer composition.

For example, this content may be from 1% to 10%; or from 10% to 15%; or from 15% to 20%; or from 20% to 25%; or from 25% to 30%; or from 30% to 35%; or from 35% to 40%; or from 40% to 45%; or from 45% to 50%; or from 50% to 55%; or from 55% to 60%; or from 60% to 65%; or from 65% to 70%; or from 70% to 75%; or from 75% to 80%; or from 80% to 85%; or from 85% to 90%; or from 90% to 95%; or from 95% to 99% by weight relative to the total weight of the heat-transfer composition.

Preferably, the heat-transfer composition according to the invention comprises a mixture of benzyltoluene and dibenzyltoluene (such as Jarylec® from the company Arkema) and at least one fluorinated or fluorochlorinated hydrocarbon, for instance, in a nonlimiting manner, hydrofluoropropane, hydrofluoropropene, hydrochlorofluoropropane, hydrochlorofluoropropene, and also mixtures thereof in all proportions.

Preferably, the heat-transfer composition according to the invention comprises 1-chloro-3,3,3-trifluoropropene (preferably in E form) and a mixture of monobenzyltoluene and dibenzyltoluene. Even more preferentially, the heat-transfer composition according to the invention consists essentially of, or even consists of, 1-chloro-3,3,3-trifluoropropene (preferably in E form) and a mixture of monobenzyltoluene and dibenzyltoluene.

In other embodiments, the heat-transfer composition according to the invention comprises a polyol ester made from pentaerythritol and at least one fluorinated or fluorochlorinated hydrocarbon, for instance, in a nonlimiting manner, hydrofluoropropane, hydrofluoropropene, hydrochlorofluoropropane, hydrochlorofluoropropene, and also mixtures thereof in all proportions.

Preferably, the heat-transfer composition according to the invention comprises 1-chloro-3,3,3-trifluoropropene (preferably in E form) and a polyol ester made from pentaerythritol. Even more preferentially, the heat-transfer composition according to the invention consists essentially of, or even consists of, 1-chloro-3,3,3-trifluoropropene (preferably in E form) and a polyol ester made from pentaerythritol.

The composition that may be used in the context of the present invention may also comprise one or more additives and/or fillers, chosen, for example, in a nonlimiting manner, from antioxidants, passivators, pour point depressants, decomposition inhibitors, fragrances and flavorings, colorants, preserving agents, and mixtures thereof. The presence of a decomposition inhibitor is particularly preferred.

Among the antioxidants that may advantageously be used in the composition, nonlimiting examples that may be mentioned include phenolic antioxidants, for instance dibutylhydroxytoluene, butylhydroxyanisole, tocopherols, and also acetates of these phenolic antioxidants; antioxidants of the amine type, for instance phenyl-α-naphthylamine, of the diamine type, for example N,N'-bis(2-naphthyl)-para-phenylenediamine, ascorbic acid and its salts, esters of ascorbic acid, alone or as mixtures of two or more thereof or with other components, for instance green tea extracts, coffee extracts.

A particularly suitable antioxidant is the product that is commercially available from the company Brenntag under the trade name Ionol®.

The passivators that may be used in the context of the present invention are advantageously chosen from triazole derivatives, benzimidazoles, imidazoles, thiazole and benzothiazole. Nonlimiting examples that may be mentioned include dioctylaminomethyl-2,3-benzotriazole and 2-dodecyldithioimidazole.

Among the pour point depressants that may be present, nonlimiting examples that may be mentioned include fatty acid esters of sucrose, and acrylic polymers such as poly(alkyl methacrylate) or poly(alkyl acrylate).

The preferred acrylic polymers are those with a molecular weight of between 50 000 g·mol$^{-1}$ and 500 000 g·mol$^{-1}$. Examples of these acrylic polymers include polymers which can contain linear alkyl groups comprising from 1 to 20 carbon atoms.

Mention may be made, among these and still as nonlimiting examples, of poly(methyl acrylate), poly(methyl methacrylate), poly(heptyl acrylate), poly(heptyl methacrylate), poly(nonyl acrylate), poly(nonyl methacrylate), poly(undecyl acrylate), poly(undecyl methacrylate), poly(tridecyl acrylate), poly(tridecyl methacrylate), poly(pentadecyl acrylate), poly(pentadecyl methacrylate), poly(heptadecyl acrylate) and poly(heptadecyl methacrylate).

An example of such a pour point depressant is commercially available from the company Sanyo Chemical Industries Ltd under the trade name Aclube.

According to a most particularly preferred aspect, a decomposition inhibitor is present as an additive. The decomposition inhibitor may be chosen in particular from carbodiimide derivatives such as diphenyl carbodiimide, ditolyl carbodiimide, bis(isopropylphenyl)carbodiimide, bis(butylphenyl)carbodiimide; but also from phenylglycidyl ethers, or esters, alkylglycidyl ethers, or esters, 3,4-epoxycyclohexylmethyl(3,4-epoxycyclohexane) carboxylate, the compounds of the anthraquinone family, for instance β-methylanthraquinone sold under the name "BMAQ", epoxide derivatives such as vinylcyclohexene diepoxides, 3,4-epoxy-6-methylcyclohexylmethyl carboxylate (3,4-epoxy-6-methylhexane), phenol novolak type epoxy resins, diglycidyl epoxy ether of bisphenol A, such as DGEBA or CEL 2021P, which are notably available from the company Whyte Chemicals.

The total amount of additives preferably does not exceed 5% by weight, in particular 4%, more particularly 3% and most particularly 2% by weight or even 1% by weight of the heat-transfer composition.

In certain embodiments, the heat-transfer composition contains impurities. When present, they may represent less than 1%, preferably less than 0.5%, preferably less than 0.1%, preferably less than 0.05% and preferably less than 0.01% (by weight) relative to the heat-transfer composition.

The heat-transfer composition according to the invention has a volume resistivity of greater than or equal to $10^6$ Ω·cm at 25° C., and preferably greater than or equal to $10^7$ Ω·cm or $10^8$ Ω·cm. The resistivity of a material represents its capacity to oppose the flow of electric current. In other words, the volume resistivity is an indication of the dielectric properties of the composition. Volume resistivity is measured according to the standard IEC 60247.

For example, this volume resistivity may be $10^6$ to $5\times10^6$ Ω·cm; or from $5\times10^6$ to $10^7$ Ω·cm; or from $10^7$ to $5\times10^7$ Ω·cm; or from $5\times10^7$ to $10^8$ Ω·cm; or from $10^8$ to $5\times10^8$ Ω·cm; or from $5\times10^8$ to $10^9$ Ω·cm; or more than $10^9$ Ω·cm.

Furthermore, the heat-transfer composition according to the invention may have a breakdown voltage at 20° C. greater than or equal to 20 kV, preferably greater than or equal to 20 kV, preferably greater than or equal to 30 kV, preferably greater than or equal to 50 kV, and more preferably greater than or equal to 100 kV. The term "breakdown voltage" means the minimum electrical voltage that makes a portion of an insulator conductive. Thus, this parameter is also an indication of the dielectric properties of the composition. The breakdown voltage is measured according to the standard IEC 60156.

For example, the breakdown voltage at 20° C. of the composition according to the invention may be from 25 to 30 kV; or from 30 to 40 kV; or from 40 to 50 kV; or from 50 to 60 kV; or from 60 to 70 kV; or from 70 to 80 kV; or from 80 to 90 kV; or from 90 to 100 kV; or from 100 to 110 kV; or from 110 to 120 kV; or from 120 to 130 kV; or from 130 to 140 kV; or from 140 to 150 kV.

The heat-transfer composition according to the invention may also have a liquid saturation temperature of from 20 to 80° C., and preferably from 30 to 70° C. at a pressure of 1 bar. For example, this temperature may be from 20 to 25° C.; or from 25 to 30° C.; or from 30 to 35° C.; or from 35 to 40° C.; or from 40 to 45° C.; or from 45 to 50° C.; or from 50 to 55° C.; or from 55 to 60° C.; or from 60 to 65° C.; or from 65 to 70° C.; or from 70 to 75° C.; or from 75 to 80° C.

The heat-transfer composition according to the invention may notably have a viscosity of from 0.1 to 20 cP at 20° C. according to the standard ISO 3104.

The heat-transfer composition according to the invention is preferably sparingly flammable or else preferably non-flammable.

Device Containing the Heat-Transfer Composition

The heat-transfer composition is contained in a device, which is suitable for allowing heat exchange of the composition with the battery, and preferably also with a secondary source.

The secondary source may be the environment, or an additional heat-transfer composition.

In certain embodiments, the device does not allow direct contact of the heat-transfer composition with the vehicle's battery; said composition flows in a heat exchanger, heat pipe or cooling plate. The dielectric properties ensure the safety of the facility in the event of it being pierced.

In certain embodiments, the device allows direct contact of the heat-transfer composition with the vehicle's battery. Preferably, the vehicle's battery is immersed in the heat-transfer composition. In this case, the device may comprise a closed enclosure containing all or part of the battery, the heat-transfer composition being contained within the enclosure and in contact with the outer wall of the battery.

This allows the thermal properties of the heat-transfer composition to be used to best advantage.

In certain embodiments, the heat-transfer composition is entirely in the liquid state.

In other embodiments, the heat-transfer composition is partly in the liquid state and partly in the gaseous state. The pressure in the enclosure containing the battery which is in direct contact or in the circuit which is in indirect contact may reach the vapor pressure of the transfer composition at the maximum surrounding temperature, which may be, for example, 70° C. in the case of a vehicle in the sun. The pressure in the enclosure may, for example, remain below 5 bar, or below 4 bar, or below 2 bar.

Cooling by direct contact of the battery with the heat-transfer composition is particularly preferred in the case where the charging of the battery is a fast charge, which involves rapid heating of the battery. The reason for this is that it enables faster heat exchange between the battery and the heat-transfer composition, thus maintaining the cooling efficiency even when the cooling requirements increase.

In the case where the battery is submerged, the heat-transfer composition can exchange heat directly with the environment through the wall of the enclosure. Heat-dissipating elements (fins or the like) may be provided on the inner surface and/or outer surface of the wall. Alternatively, the heat-transfer composition may exchange heat with an additional heat-transfer composition, via a heat exchanger located in the enclosure or via plates or channels on the wall of the enclosure. Alternatively, the heat-transfer composition may undergo circulation into and out of the enclosure so as to exchange heat with the environment, or with an additional heat-transfer composition, in a heat exchanger external to the enclosure.

Alternatively, the heat-transfer composition may exchange heat with the battery via a heat exchanger. The device may then comprise a circuit in which the composition flows. The heat exchanger may notably be of the fluid/solid type, for example a plate exchanger.

Preferably, the circuit does not comprise a compressor. In other words, the circuit is not a vapor compression circuit.

The heat-transfer composition may remain in the liquid state as it passes through the heat exchanger, or conversely it may undergo total or partial evaporation or condensation, depending on whether it is used for cooling or heating.

Means for circulating the composition, for example a pump, may be provided.

When an additional heat-transfer composition is provided, this may be present in an additional circuit, which may notably be a vapor compression circuit. The heat exchange between the compositions is performed in an additional heat exchanger, which may be, for example, co-current or, preferably, counter-current.

The additional heat-transfer composition can itself exchange heat with the environment, by means of an additional heat exchanger. It can optionally also be used to heat or cool the air in the passenger compartment.

To this end, the additional circuit may include various branches with separate heat exchangers, the additional heat-transfer composition flowing or not in these branches, depending on the operating mode. Optionally, alternatively or additionally, the additional circuit may include means for changing the direction of flow of the additional heat-transfer composition, for example comprising one or more three-way or four-way valves.

The term "countercurrent heat exchanger" means a heat exchanger in which heat is exchanged between a first fluid and a second fluid, the first fluid at the inlet of the exchanger exchanging heat with the second fluid at the outlet of the exchanger, and the first fluid at the outlet of the exchanger exchanging heat with the second fluid at the inlet of the exchanger.

For example, countercurrent heat exchangers comprise devices in which the flow of the first fluid and the flow of the second fluid are in opposite directions or virtually opposite directions. Exchangers operating in crosscurrent mode with a countercurrent tendency are also included among countercurrent heat exchangers.

The heat exchangers can in particular be exchangers having U-shaped tubes, a horizontal or vertical tube bundle, spirals, plates or fins.

Temperature Control

The invention relates to the use of a heat-transfer composition according to the invention for regulating the temperature of the battery by maintaining a uniform temperature. Preferably, the composition is used for cooling the battery. It may also be used for heating the battery. Heating and cooling may be alternated depending on the need (outdoor temperature, battery temperature, operating mode of the battery).

Heating may also be performed at least partly by means of an electrical resistance.

It is thus possible to dedicate the heat-transfer composition according to the invention only to the uniform cooling of the battery, whereas other means, for example an electrical resistance, are used for heating it.

The term "temperature of the battery" generally means the temperature of an outer wall of one or more of its electrochemical cells.

The temperature of the battery can be measured by means of a temperature sensor. If several temperature sensors are present on the battery, the temperature of the battery can be regarded as being the mean of the various temperatures measured. The invention makes it possible to considerably reduce the difference between the temperatures measured at different points in the battery.

The temperature control can be performed when the vehicle's battery is being charged. Alternatively, it can be performed when the battery is discharging, notably when the vehicle's engine is switched on. It notably prevents the battery temperature from becoming excessive, on account of the outside temperature and/or on account of the intrinsic heating of said battery when it is functioning.

In particular, the charging of the battery can be fast charging. Thus, during the complete charging of the battery (from a moment when the battery is completely discharged) over a period of less than or equal to 30 minutes, and preferably less than or equal to 15 minutes, the use of the composition according to the invention makes it possible to keep the temperature of the battery within an optimum temperature range with a uniform distribution. This is advantageous given that, during rapid charging, the battery tends to heat up rapidly and to reach high temperatures, notably with hot spots which may have an effect on its functioning, performance and life.

In certain embodiments, the cooling of the battery is continuous over a certain period of time.

In certain embodiments, the cooling and optionally the heating allow the battery temperature to be maintained within an optimum temperature range, in particular when the vehicle is in operation (engine running), and notably when the vehicle is moving. Specifically, if the battery temperature is too low, its performance is liable to decrease significantly.

In certain embodiments, the temperature of the vehicle's battery may thus be maintained between a minimum temperature $t_1$ and a maximum temperature $t_2$.

In certain embodiments, the minimum temperature $t_1$ is greater than or equal to 10° C. and the maximum temperature $t_2$ is less than or equal to 80° C.; preferably, the minimum temperature $t_1$ is greater than or equal to 15° C. and the maximum temperature $t_2$ is less than or equal to 70° C., and more preferably the minimum temperature $t_1$ is greater than or equal to 16° C. and the maximum temperature $t_2$ is less than or equal to 50° C.

A feedback loop is advantageously present to modify the operating parameters of the facility as a function of the measured temperature of the battery, so as to ensure maintenance of the desired temperature.

The outside temperature during the time that the vehicle's battery temperature is maintained between the minimum temperature $t_1$ and the maximum temperature $t_2$ may notably be from −60 to −50° C.; or from −50 to −40° C.; or from −40 to −30° C.; or from −30 to −20° C.; or from −20 to −10° C.; or from −10 to 0° C.; or from 0 to 10° C.; or from 10 to 20° C.; or from 20 to 30° C.; or from 30 to 40° C.; or from 40 to 50° C.; or from 50 to 60° C.; or from 60 to 70° C.

The term "outside temperature" means the ambient temperature outside the vehicle before and during the maintenance of the temperature of the vehicle's battery between the minimum temperature $t_1$ and the maximum temperature $t_2$.

EXAMPLES

Example 1—Miscibility and Dielectric Properties

Compositions were prepared by combining HCFO-1233zdE as refrigerant with a mixture of benzyltoluene and dibenzyltoluene (sold by Arkema under the name Jarylec® C101). It was first verified that the two products were miscible in all proportions.

The oil was introduced by weighing out in a 0.34 L autoclave equipped with a magnetic stirrer and a jacket in which flows a heat-transfer fluid so as to homogenize the temperature in the gas phase and the liquid phase.

The autoclave was then cooled to −10° C., at which point the vacuum was drawn.

The HCFO-1233zdE contained in a cylinder was transferred in closed circuit mode as a liquid phase by weighing out.

The minimum volume of liquid introduced was calculated so that the composition of the liquid phase did not vary as a function of the temperature.

The final mixture was brought to the desired temperature with stirring so as to homogenize it. The stirring was then switched off until the mixture reached equilibrium. The temperature and pressure were recorded at equilibrium.

FIG. 1 shows the influence of the content of refrigerant on the liquid saturation temperature of the composition at a saturating vapor pressure of 1 bar. More particularly, it may be seen that, relative to a composition comprising 100% oil, the addition of refrigerant to the composition, even in a low content, significantly reduces the liquid saturation temperature of the composition, thus increasing the capacity for cooling the battery.

A composition was prepared by mixing 69.2 g of HCFO-1233zd E and 100.5 g of Jarylec® C101 from the company Arkema under the conditions presented below.

TABLE 1

| T autoclave (° C.) | Pressure (bar abs) | Observations |
|---|---|---|
| 20 | 0.71 | miscible |
| 60 | 2.5 | miscible |

Another composition was prepared by mixing 35% by weight of HCFO-1233zdE and 65% by weight of Jarylec® C101, from the company Arkema, under the conditions presented below.

The breakdown voltage was measured according to the standard IEC 60159:1995.

TABLE 2

| Jarylec ® C101 (weight %) | R1233zd E (weight %) | Resistivity at 10° C. | Breakdown voltage at 20° C. (kV) |
|---|---|---|---|
| 100 | 0 | $3.12 \times 10^{13}$ | 90 |
| 65 | 35 | $1.50 \times 10^{12}$ | 69.7 |
| 0 | 100 | $1.56 \times 10^{10}$ | 47.3 |

Example 2—Viscosity

Viscosity measurements were performed in a jacketed autoclave reactor with a capacity of 0.2 L, in which flows a heat-transfer fluid, into which reactor was introduced the oil Jarylec® C101. The reactor was cooled to −10° C. and magnetically stirred. Then HCFO-1233zdE was introduced by pressure difference. The reactor was then brought to the measurement temperature.

The viscosity was then measured with a vibrating-rod viscometer, model MIVI 9601 from Sofraser. A camera was used to confirm the miscibility of the oil and the refrigerant under the conditions of the measurement and to check the immersion of the viscometer rod, before taking the measurement.

TABLE 3

| Content of HCFO-1233zd E | 0% | 10% | 0% | 10% |
|---|---|---|---|---|
| T (° C.) | 20 | 20 | 0 | 0 |
| Dynamic viscosity (cP) | 6.0 | 3.9 | 12 | 6.5 |

For comparative purposes, a viscosity measurement according to the standard ISO 3104 was performed on the oil (0% HCFO-1233zd E) at 20° C. The value obtained is 6.5 cP.

Example 3—Flammability

A flash point measurement was performed on a composition containing 90% by weight of Jarylec® C101 oil and 10% by weight of HCFO-1233zdE, and also on a comparative composition containing 100% by weight of Jarylec® C101 oil.

The mixture was prepared at low temperature, under atmospheric pressure. It is homogeneous and liquid at ambient temperature and atmospheric pressure.

The flash point measurement was performed according to the standard ISO 3679 or ISO3680, "Flash/no-flash type flash point test—rapid closed cup equilibrium method". The standardized tests are performed with the filling port left free, thus open and breathing to the atmosphere, with the cup closed.

The tests were adapted on a case-by-case basis by blocking the filling port so as to simulate an even more confined device during temperature equilibrium (2 minutes under standardized conditions). In this case, the tests are performed with the "lid blocked".

The temperature range explored was up to 300° C.

TABLE 4

| Content of HCFO-1233zd E | 0% | 10% |
|---|---|---|
| Flash point | 138° C. | Not detected |

Example 4—Heat Transfer Coefficient (Two-Phase Immersion)

In order to perform heat transfer coefficient measurements, a test device is used, placed in a thermal regulation chamber, to measure the performance of fluids by varying the ambient temperature. The test device comprises a container equipped with a heating element and a condenser. The condenser is located at the top of the container and is cooled by means of an ice-cold water loop. The heating element is a cylindrical resistor 15 mm in diameter and 80 mm tall in a copper sheath, which is immersed vertically in a cylinder filled with saturated liquid so as to heat it. It can deliver up to 15 W/cm$^2$. Eight temperature sensors are placed on the copper sheath to measure the surface temperature.

Two different mixtures of an oil whose properties, in particular the viscosity, are similar to that of Jarylec® C101 oil, and whose properties, in particular the thermal (thermal conductivity greater than 0.05 W/(m$^2$·K) and dielectric properties, meet the specifications for this application, and of HCFO-1233zdE were tested. The HCFO-1233zdE was first introduced while avoiding any introduction of moisture or of air pollution. The oil was added by gravity using a graduated cylinder. The miscibility and homogeneity were checked by sampling.

The cooling water temperature (temperature of 10° C. at the condenser) and the flow rate were set to the desired values. The ambient temperature was set at 26° C. The thermal power was increased from 0 to 90 W in 5 W increments and then decreased again for the detection of hysteresis. An average heat transfer coefficient value was measured during the temperature rise: $H=F/(T_w-T_{sat})$, with F being the heat flux density, $T_w$ the wall temperature, and $T_{sat}$ the liquid saturation temperature of the measured composition.

TABLE 5

| HCFO-1233zdE (weight %) | 30 | 60 | 30 | 60 | 60 |
|---|---|---|---|---|---|
| F (W/cm$^2$) | 0.5 | 0.5 | 1.5 | 1.5 | 2.5 |
| H (W/(m$^2$ · ° K)) | 197 | 573 | 441 | 973 | 1548 |

Example 5—Heat Transfer Coefficient (Single-Phase Immersion)

In order to make comparative heat transfer coefficient measurements, a test device is used comprising a module of 36 prismatic cells (one real lithium titanate cell surrounded by 35 dummy cells) in a hermetic housing. The cells and the busbar are immersed in a liquid circulating at a rate of from 0.5 L/min to 40 L/min. The liquid inlet and outlet temperatures, the flow rate and the pressure are measured and monitored. The liquid is cooled externally.

The cells are cooled on their small surfaces. The liquid passages are arranged in parallel. The module is equipped with 26 temperature sensors, eight of which are distributed on one of the large surfaces of the real cell.

The tests were performed at different heat flux densities F between 0 and 1 W/cm$^2$. F is equal to the total thermal power supplied divided by the total exchange area.

The liquid tested was either an oil with a viscosity similar to that of Jarylec® C101 or a mixture of this oil with HCFO-1233zdE. The HCFO-1233zdE was first introduced while avoiding any introduction of moisture or of air pollution. The oil was added by gravity using a graduated cylinder. The miscibility and homogeneity were checked by sampling.

The device was used in automatic test mode, with a heat flux density F of 0.25 W/cm$^2$ (adjusted by varying the power supplied) and an average fluid temperature of 15° C. (average of the liquid temperature at the housing inlet and the liquid temperature at the housing outlet). For a given heat flux density, the liquid flow rate was increased up to the maximum pumping speed, which depends on the fluid.

The heat transfer coefficient H corresponds to the heat flux density divided by the difference between the average cell temperature and the fluid temperature at the housing inlet.

TABLE 6

| HCFO-1233zdE (weight %) | Liquid flow rate (L/min) | H W/(m² · ° K) |
|---|---|---|
| 10 | 15 | 146 |
| 0 | 15 | 152 |
| 10 | 18 | 167 |

With the pure oil, the maximum liquid flow rate that can be achieved is 15 L/min. With the composition comprising 10% HCFO-1233zdE, the maximum liquid flow rate that can be achieved is 18 L/min.

The invention claimed is:

1. The use of a heat-transfer composition, the heat-transfer composition comprising at least one refrigerant chosen from halogenated hydrocarbons, perhalogenated hydrocarbons, fluorinated ketones, fluorinated ethers and also combinations thereof, and at least one dielectric fluid, for regulating the temperature of an item of equipment chosen from a battery, an electrical component or a fuel cell, the heat-transfer composition having a volume resistivity of greater than or equal to 106 Ω·cm at 25° C.

2. The use as claimed in claim 1, in which the refrigerant comprises or is 1-chloro-3,3,3-trifluoropropene.

3. The use as claimed in claim 1, in which the refrigerant is present in a content of from 10% to 80% by weight relative to the total weight of the heat-transfer composition.

4. The use as claimed in claim 1, in which the dielectric fluid is chosen from mineral dielectric oils, synthetic dielectric oils, and vegetable dielectric oils.

5. The use as claimed in claim 1, in which the dielectric fluid is present in a content of from 20% to 90% by weight relative to the total weight of the heat-transfer composition.

6. The use as claimed in claim 1, in which the heat-transfer composition has a liquid saturation temperature of from 20 to 80° C., at a pressure of 1 bar.

7. The use as claimed in claim 1, in which the heat-transfer composition has a breakdown voltage of greater than or equal to 20 kV at 20° C.

8. The use as claimed in claim 1, in which the heat-transfer composition consists essentially of 1-chloro-3,3,3-trifluoropropene and a mixture of monobenzyltoluene and dibenzyltoluene.

9. The use as claimed in claim 1, in which the heat-transfer composition consists essentially of 1-chloro-3,3,3-trifluoropropene and a polyol ester synthesized from pentaerythritol.

10. The use as claimed in claim 1, in which the heat-transfer composition exchanges heat with an additional heat-transfer composition.

11. The use as claimed in claim 1, for the cooling of equipment.

12. The use as claimed in claim 1, in which the regulation of the temperature of the equipment is performed by placing the equipment in direct contact with the heat-transfer composition.

13. The use as claimed in claim 1, in which the equipment is a battery of an electric or hybrid vehicle.

14. The use as claimed in claim 1, performed during charging of the vehicle's battery, the vehicle's battery preferably being fully charged in a time of less than or equal to 30 minutes.

* * * * *